United States Patent [19]
Donohoe et al.

[11] Patent Number: 6,025,276
[45] Date of Patent: Feb. 15, 2000

[54] SEMICONDUCTOR PROCESSING METHODS OF FORMING SUBSTRATE FEATURES, INCLUDING CONTACT OPENINGS

[75] Inventors: Kevin G. Donohoe; Werner Juengling, both of Boise, Id.

[73] Assignee: Micron Technology, Inc., Boise, Id.

[21] Appl. No.: 09/146,844

[22] Filed: Sep. 3, 1998

[51] Int. Cl.[7] .................................................. H01L 21/00
[52] U.S. Cl. ............................ 438/734; 216/39; 438/723
[58] Field of Search .................................. 438/710, 723, 438/734, 743; 216/18, 39, 67, 79, 80

[56] References Cited

U.S. PATENT DOCUMENTS

| | | | |
|---|---|---|---|
| 4,985,374 | 1/1991 | Tsuji et al. .......................... | 438/734 X |
| 5,637,189 | 6/1997 | Peeters et al. ......................... | 438/719 |
| 5,926,732 | 7/1999 | Matsuura ............................. | 438/734 X |

*Primary Examiner*—William Powell
*Attorney, Agent, or Firm*—Wells, St. John, Roberts, Gregory & Matkin P.S.

[57] ABSTRACT

Semiconductor processing methods of forming substrate features, e.g. openings, and in particular, methods of forming contact openings are described. In one embodiment, a pair of openings are formed in a first layer over a substrate to first selected depths defined by respective opening bases. A second layer is formed within the openings and over the opening bases. The second layer has different thicknesses relative to the bases over which it is formed. A portion of the base of only one of the openings is exposed through the second layer, and material elevation ally there below is removed. In another embodiment, the openings are defined by sidewalls which join with the respective bases. The second layer is formed within the openings and over at least some of the sidewalls of each opening and has a different thickness over sidewall portions of each opening which are disposed at common substrate elevations. A portion of one of the opening bases is exposed through the second layer and material there below is removed. In another embodiment, a same material is utilized to form sidewall spacers over a substantial portion of the sidewalls of only one of the openings, and to form a layer over a substantial portion of the base of the other of the openings. Material elevation ally below the base of the one opening is selectively etched relative to material comprising the sidewall spacers, and to a selected second depth which is greater than the first depth.

49 Claims, 5 Drawing Sheets

SEMICONDUCTOR PROCESSING METHODS OF FORMING SUBSTRATE FEATURES, INCLUDING CONTACT OPENINGS

TECHNICAL FIELD

This invention relates to semiconductor processing methods of forming substrate features, and in particular, to methods of forming at least two openings in a substrate, such as contact openings.

BACKGROUND OF THE INVENTION

Semiconductor processing often involves etching, or otherwise forming openings over a substrate to expose desired substrate features. One type of opening which can be formed is a contact opening. Contact openings typically extend to conductive lines or diffusion regions with which electrical communication is desired. Such contact openings are then filled with conductive material and processing continues. In some instances, it is desirable to form openings, such as contact openings, to variable depths over a substrate. Such can be the case, for example, when certain lower elevation features are desired to be exposed without etching other higher elevation features.

It is generally desirable in semiconductor processing to minimize the number of processing steps which are utilized in forming integrated circuitry. Such can reduce the risk of a processing mistake adversely impacting the resultant circuitry.

This invention arose out of concerns associated with improving the manner in which integrated circuitry is formed. This invention also arose out of concerns associated with providing flexible processing methods which permit openings, and in particular contact openings, to be formed to different elevations over a substrate.

SUMMARY OF THE INVENTION

Semiconductor processing methods of forming substrate features, e.g. openings, and in particular, methods of forming contact openings are described. In one embodiment, a pair of openings are formed in a first layer over a substrate to first selected depths defined by respective opening bases. A second layer is formed within the openings and over the opening bases. The second layer has different thicknesses relative to the bases over which it is formed. A portion of the base of only one of the openings is exposed through the second layer, and material elevationally therebelow is removed. In another embodiment, the openings are defined by sidewalls which join with the respective bases. The second layer is formed within the openings and over at least some of the sidewalls of each opening and has a different thickness over sidewall portions of each opening which are disposed at common substrate elevations. A portion of one of the opening bases is exposed through the second layer and material there below is removed. In another embodiment, a same material is utilized to form sidewall spacers over a substantial portion of the sidewalls of only one of the openings, and to form a layer over a substantial portion of the base of the other of the openings. Material elevation ally below the base of the one opening is selectively etched relative to material comprising the sidewall spacers, and to a selected second depth which is greater than the first depth.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
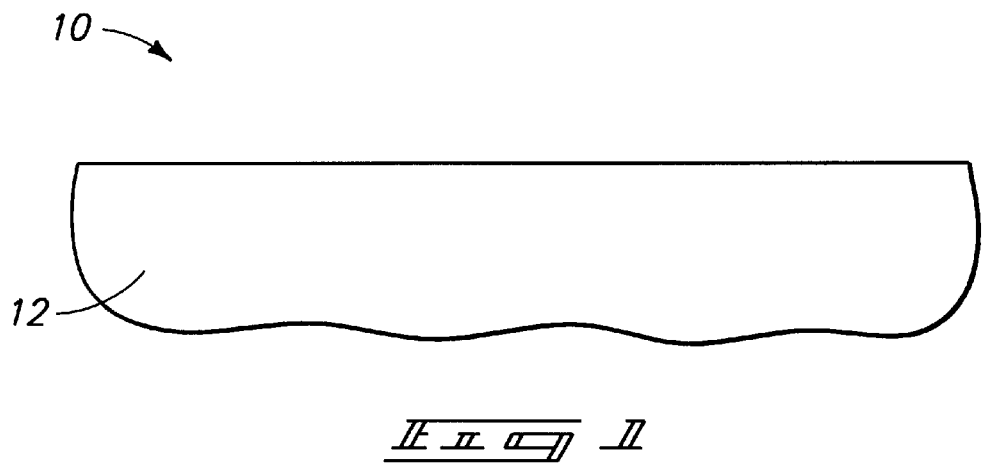
FIG. 1 is a diagrammatic sectional view of a wafer fragment in process in accordance with one embodiment of the invention.

Referring to FIG. 1, a semiconductor wafer fragment in process is shown generally at 10 and comprises a semiconductive substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 2:
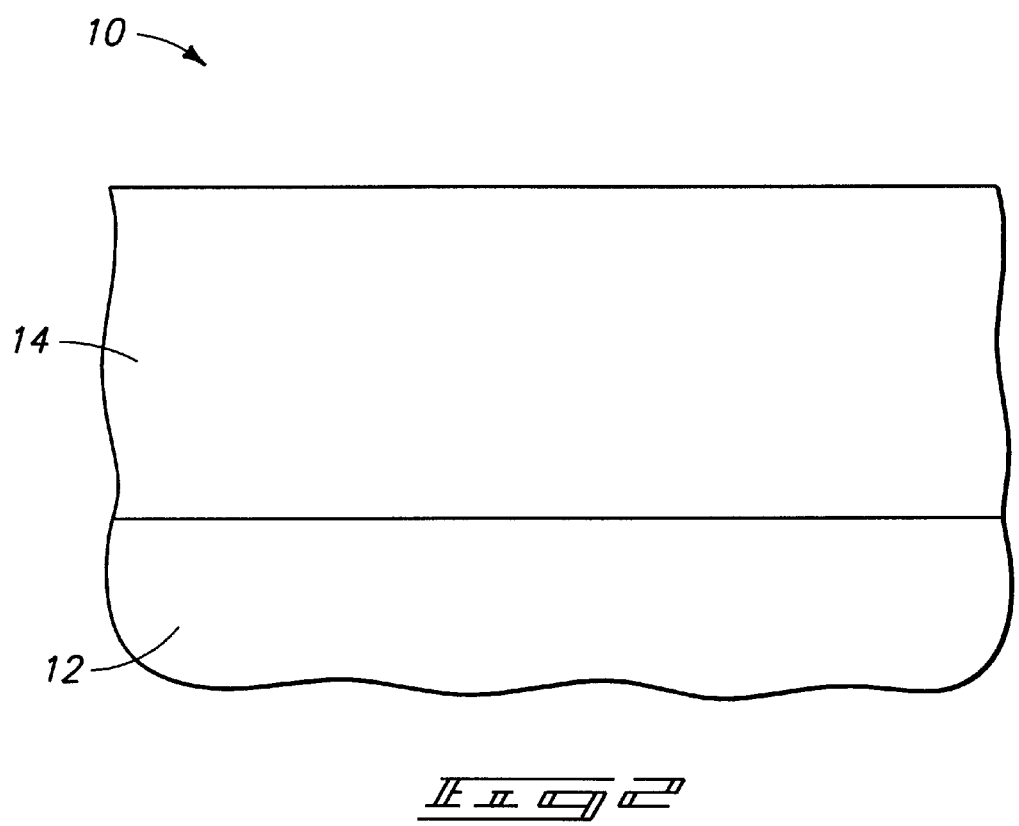
FIG. 2 is a view of the FIG. 1 wafer fragment at a processing step subsequent to that shown by FIG. 1.

Referring to FIG. 2, a layer of material 14 is formed over substrate 12 and comprises material into or through which a pair of substrate features are to be etched. In one embodiment, the substrate features comprise openings, e.g. contact openings, which are to be etched, and layer 14 comprises an insulative oxide or dielectric material such as borophosphosilicate glass (BPSG). For purposes of the ongoing discussion, layer 14 comprises a first layer of material.

Figure 3:
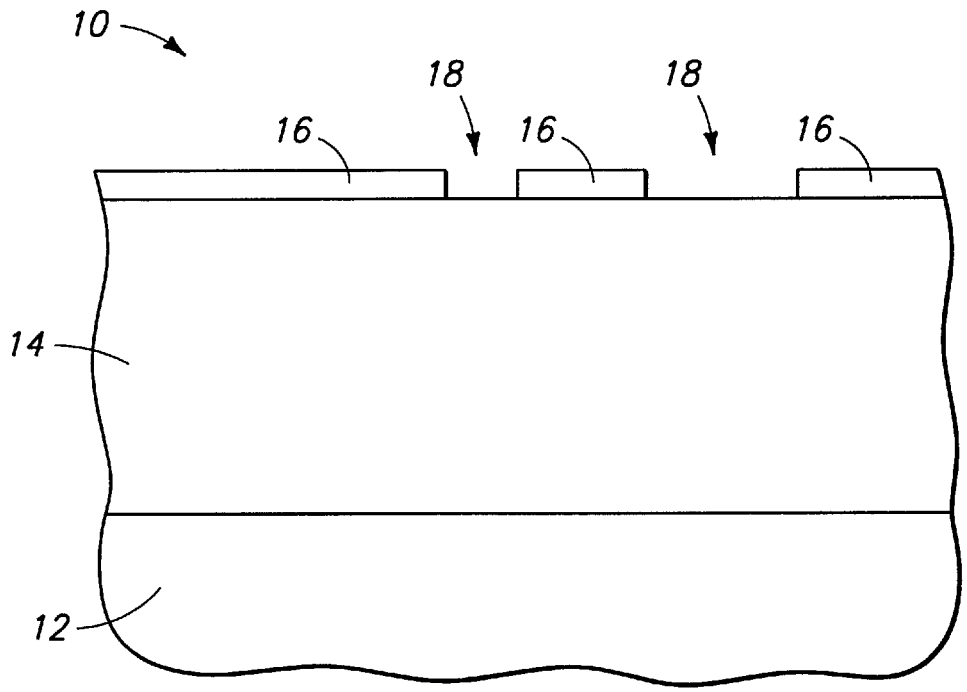
FIG. 3 is a view of the FIG. 1 wafer fragment at a processing step subsequent to that shown by FIG. 2.

Referring to FIG. 3, a masking layer 16 is formed over first layer 14 and a pair of masking layer openings 18 are patterned into the masking layer. The patterned masking layer defines the substrate features which are to be etched. Preferably, masking layer 16 comprises a layer of photoresist through which a pair of contact openings are to be etched. The openings are preferably of different size for production of different size and depth openings within layer 14, as explained further below.

Figure 4:
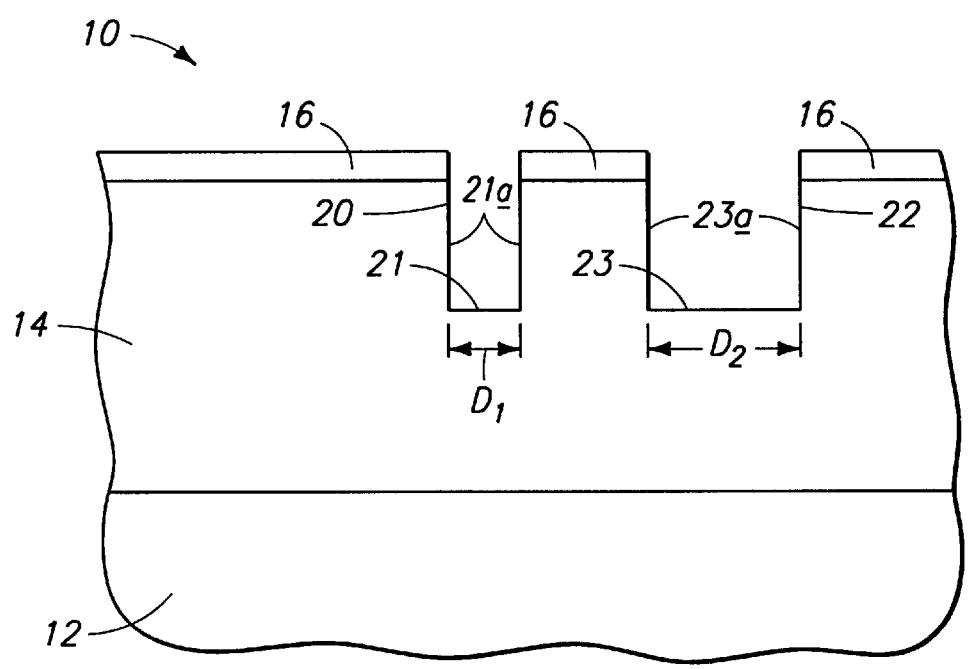
FIG. 4 is a view of the FIG. 1 wafer fragment at a processing step subsequent to that shown by FIG. 3.

Referring to FIG. 4, material of first layer 14 is first etched to form a pair of first openings 20, 22. An exemplary etcher in which processing can take place is the Lam 9100 Etcher. Exemplary conditions are as follows: TCP power at 450 Watts, Bias power at 750 Watts, with gas flows of $CHF_3$ at 50 sccm, Ar at 15 sccm and a pressure of 18 mTorr. In the illustrated example, the openings do not extend entirely through layer 14, and terminate proximate respective bases 21, 23. The openings are preferably formed to a common or same first selected depth which is defined by respective bases 21, 23. An exemplary same first selected depth is 10,000 Angstrom. Where first layer 14 comprises BPSG, utilizing the above-mentioned etch parameters can etch to the first selected depth in about 85 seconds.

Openings 20, 22 are also defined in part by respective sidewalls 21a, 23a which join with bases 21, 23 respectively. In this example, the sidewalls of each opening define minimum distances therebetween which are different. For example, sidewalls 21a define a minimum distance $D_1$, and sidewalls 23a define a distance $D_2$, where $D_1$ is less than $D_2$. The differing minimum distances provide transverse cross sections which are different from one another. Contact opening 22 has a transverse cross section which is greater than the transverse cross section of opening 20.

Alternately considered, a plurality of substrate features are contemporaneously etched over the substrate. Some of the features have transverse cross sections which are different from and preferably larger than transverse cross sections of other features. In the case where the substrate features comprise openings such as openings 20, 22, the transverse cross section of opening 22 is larger than that of opening 20.

Figure 5:
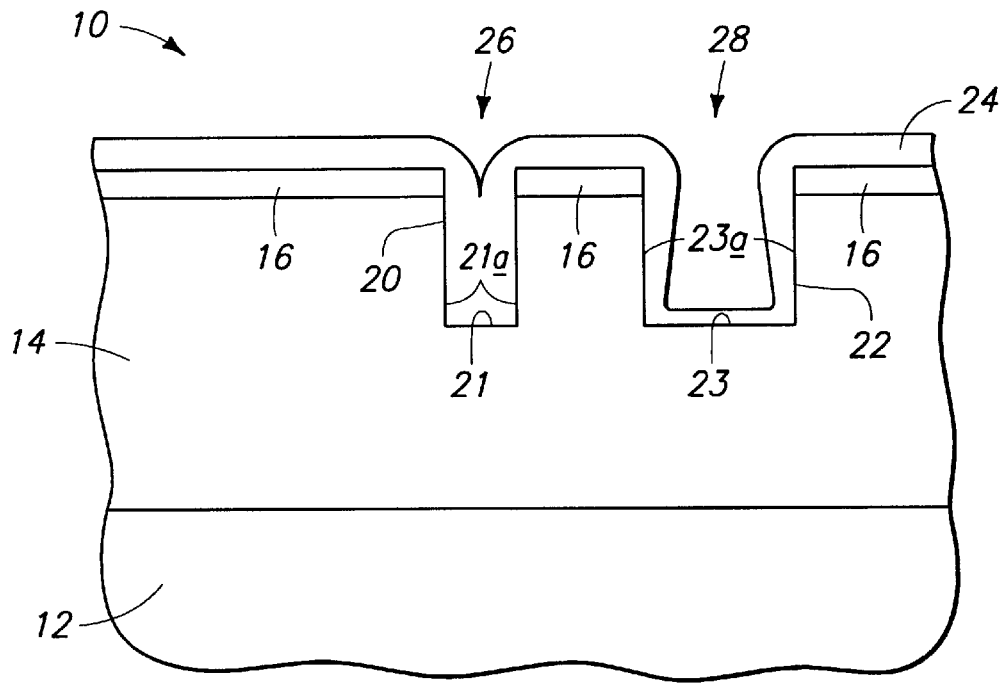
FIG. 5 is a view of the FIG. 1 wafer fragment at a processing step subsequent to that shown by FIG. 4.

Referring to FIG. 5, a second layer 24 is formed over substrate 12, including masking layer 16, within openings 20, 22, and over bases 21, 23. In this example, the second layer has different respective thicknesses relative to the bases over which it is formed. For example, the thickness of second layer 24 over base 23 is less than the thickness of second layer 24 over base 21. For purposes of the ongoing discussion, second layer 24 constitutes a same or common material which is formed within both of openings 20, 22. In the FIG. 5 embodiment, such same material is formed sufficiently to redefine narrower openings 26, 28 inside the previously-formed openings 20, 22. An exemplary and preferred material for layer 24 is a polymer such as a fluorocarbon polymer. Using a Lam 9100 Etcher, such layer can be formed or deposited over the substrate using the following conditions: TCP power at 450 Watts, Bias power from between 0 to 50 Watts, with gas flows of $CHF_3$ at 50 sccm and a pressure of 18 mTorr. Processing with these parameters can deposit a polymer layer to a thickness of about 1000 Angstrom in about 30 seconds. Adjustments can be made to the bias as well as the deposition time to improve or change the fill characteristics of the deposit. In this example, layer 24 is formed sufficient to occlude at least some of the substrate features having the smaller transverse cross sections.

Figure 6:
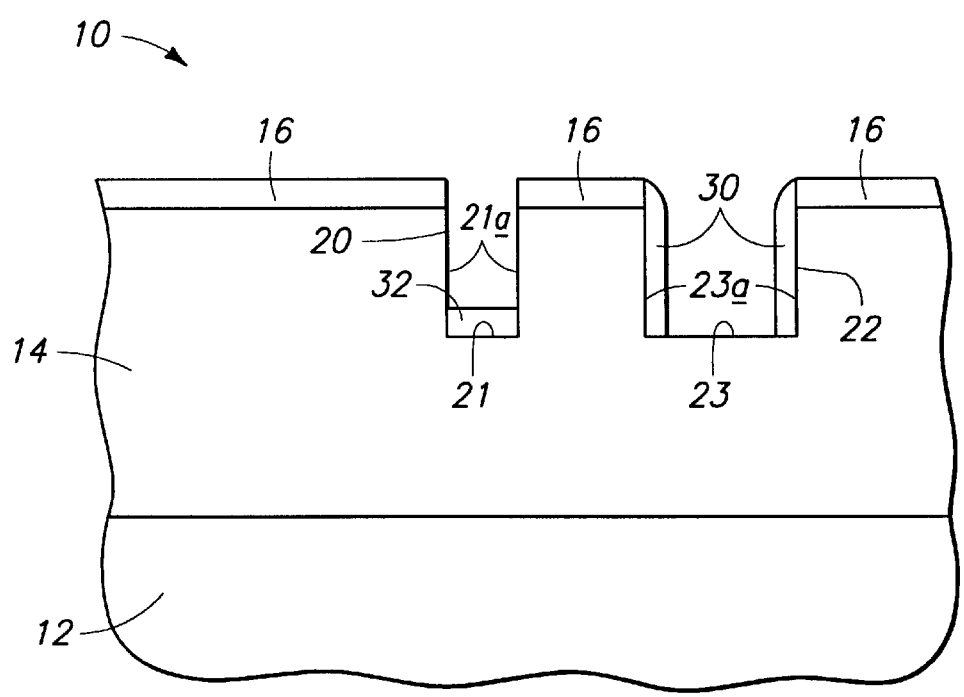
FIG. 6 is a view of the FIG. 1 wafer fragment at a processing step subsequent to that shown by FIG. 5.

Referring to FIG. 6, a portion of base 23 is exposed through second layer 24 (FIG. 5). As shown, a portion of the base of only one of the openings is exposed. Hence, second layer material is provided over less than an entirety of only one opening base, and over an entirety of only the other opening base. Accordingly, base 21 of opening 20 remains covered with material of second layer 24. In the illustrated example, material of layer 24 has been etched, preferably anisotropically, sufficiently to form sidewall spacers 30 over a predominate portion of sidewalls 23a, and to expose base 23. The etching of the material of layer 24 also preferably leaves remnant material behind within opening 20, to form a layer 32 over a predominate portion of base 21. The etching of layer 24 preferably comprises a maskless anisotropic etch. Alternately considered, second layer 24 has a different thickness over sidewall portions of each opening which are disposed at common distances above the base with which it is joined. In this example, material of second layer 24, e.g. sidewall spacers 30, is formed over the entirety of the sidewalls of only one opening.

Figure 7:
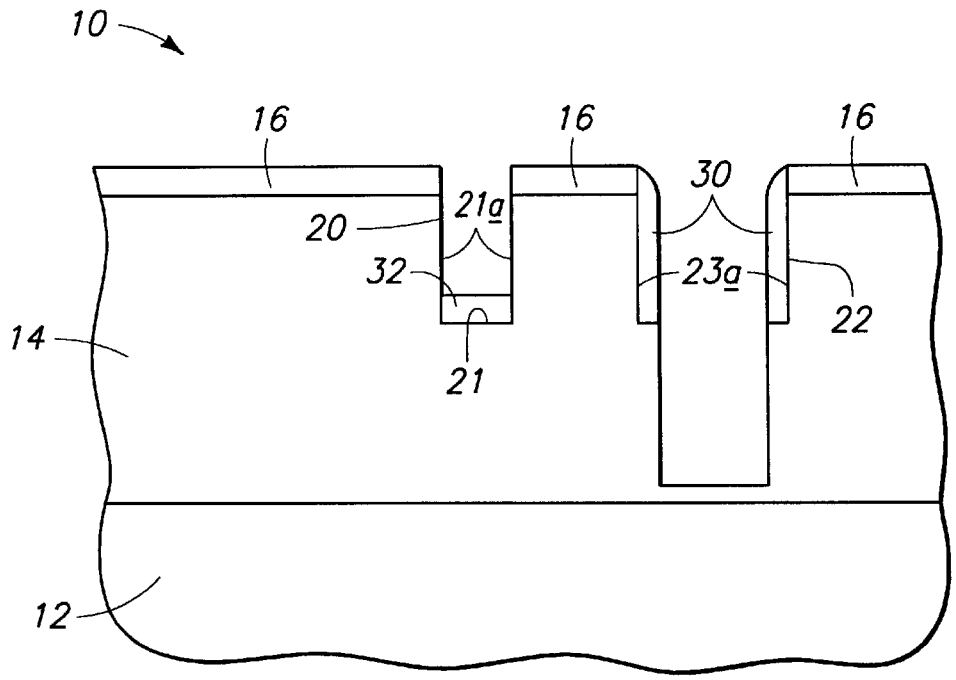
FIG. 7 is a view of the FIG. 1 wafer fragment at a processing step subsequent to that shown by FIG. 6.

Referring to FIG. 7, material within opening 22 is removed elevationally below the exposed portion of base 23 (FIG. 6). Such material is preferably etched substantially selectively relative to material from which sidewall spacers 30 are formed, and selectively relative to remaining layer 32. Accordingly, such etch does not etch material from elevationally below base 21 of opening 20. Such etch preferably defines a selected second depth which is greater than the first depth. In one embodiment, the further etching of the features having the larger of the transverse cross sections is conducted in such a way as to maintain at least some of the features having the smaller of the transverse cross sections at the first selected depth. Exemplary conditions using the Lam 9100 etcher are as follows: TCP power at 450 Watts, Bias power at 750 Watts, with gas flows of $CHF_3$ at 50 sccm, Ar at 15 sccm and a pressure of 18 mTorr. Using the above etch parameters, a second depth of about 20,000 Angstrom can be achieved in about 85 seconds. Alternately considered, the etching of the material elevationally below base 23 comprises not etching material elevationally below base 21.

Figure 8:
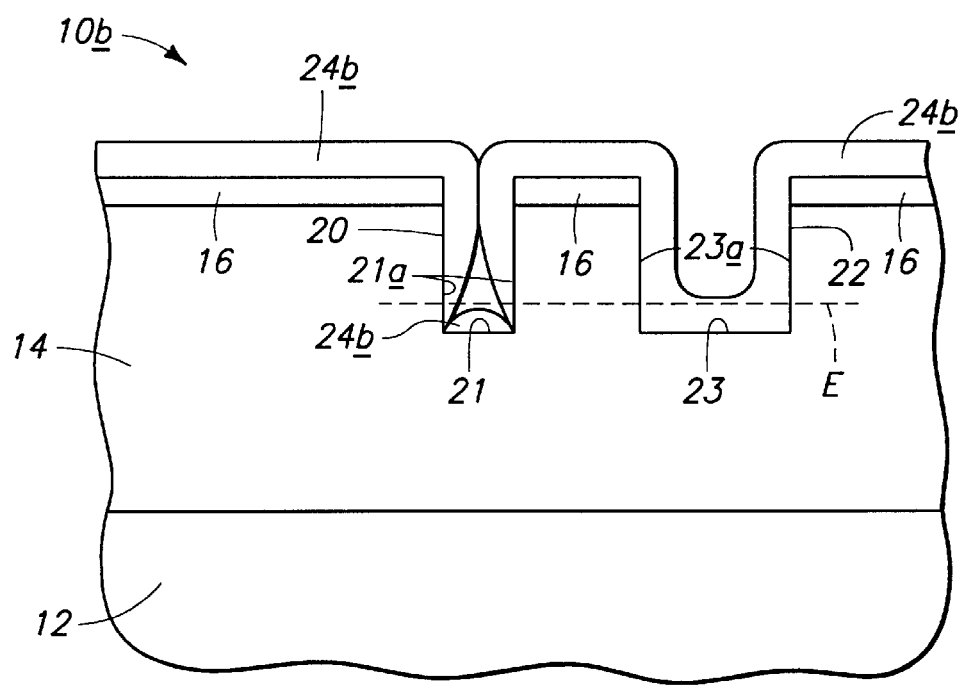
FIG. 8 is a diagrammatic sectional view of a wafer fragment in process in accordance with another embodiment of the invention.
Figure 9:
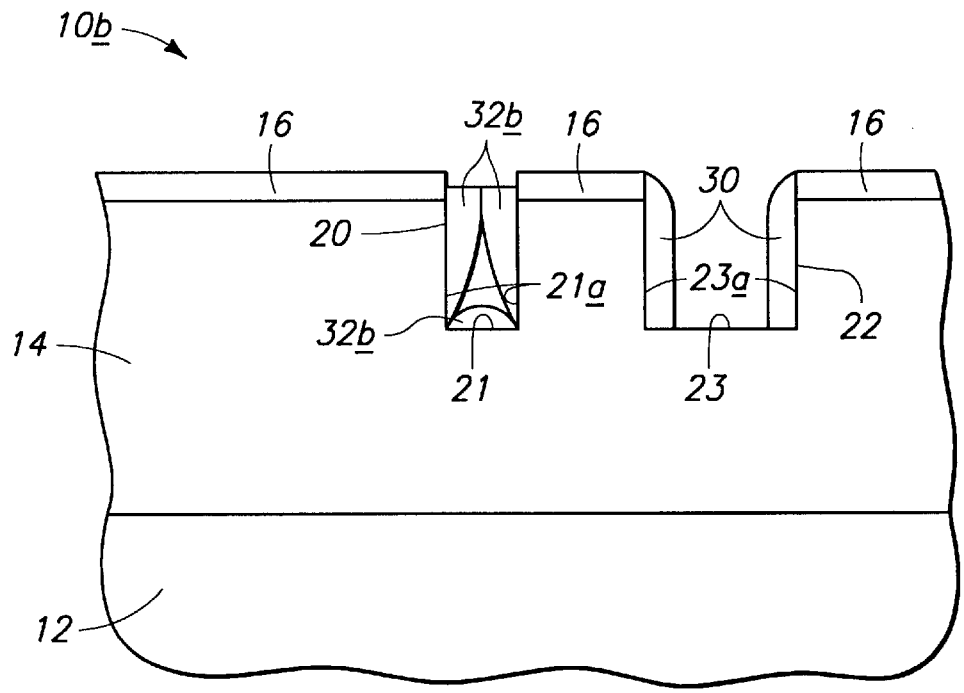
FIG. 9 is a view of the FIG. 8 wafer fragment at a processing step subsequent to that shown by FIG. 8.
Figure 10:
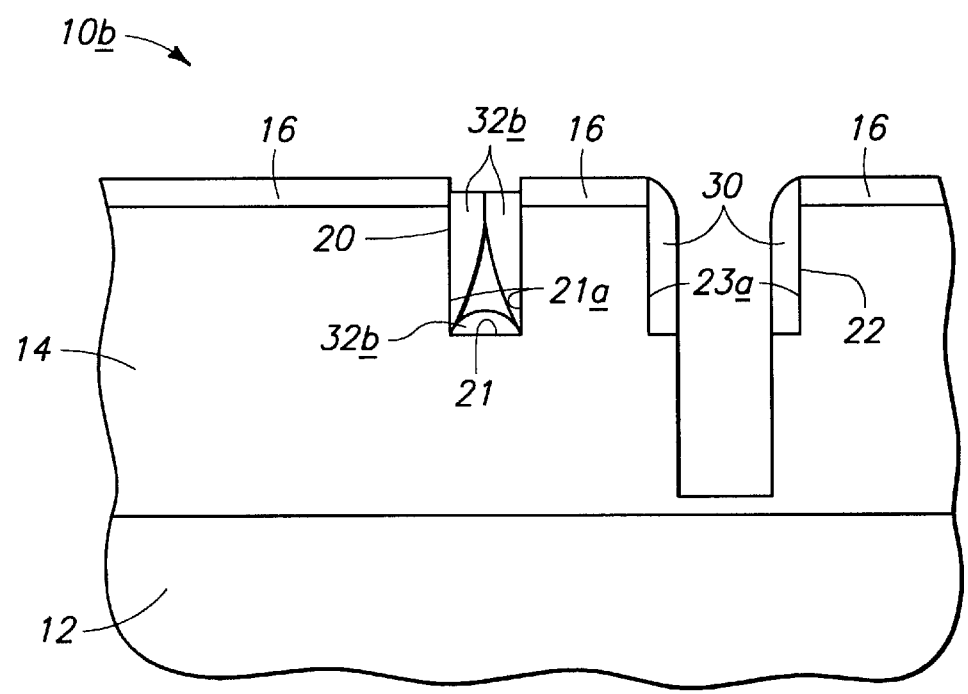
FIG. 10 is a view of the FIG. 8 wafer fragment at a processing step subsequent to that shown by FIG. 9.

Referring to FIGS. 8–10, an alternate embodiment is shown generally at 10b. Processing proceeds relative to the FIG. 4 wafer fragment. Like numerals from the FIG. 5 embodiment are utilized, with differences being indicated by the suffix "b".

Referring to FIG. 8, the same second layer 24b is formed over substrate 12, including masking layer 16, and within openings 20, 22. At least a portion of sidewalls 21a of opening 20 can be left uncovered with second layer material, particularly where layer 24b tapers toward the base of opening 20 at a greater degree. The second layer has a different thickness over sidewall portions of each opening which are disposed at common substrate elevations. An exemplary elevation is shown at E. Material of second layer 24 occludes a top portion of opening 20 and conformally covers within opening 22.

Referring to FIG. 9, a portion of base 23 is exposed through second layer 24b. As shown, a portion of the base of only one of the openings is exposed. Hence, second layer material is provided over less than an entirety of only one opening base, and over an entirety of only the other opening base. Accordingly, base 21 of opening 20 remains covered with material of second layer 24b. In the illustrated example, material of layer 24b has been etched, preferably anisotropically, sufficiently to form sidewall spacers 30 over a predominate portion of sidewalls 23a, and to expose base 23. The etching of the material of layer 24b also preferably leaves remnant material behind within opening 20, to form layer 32b over a predominate portion of base 21. The etching of layer 24b preferably comprises a maskless anisotropic etch. Alternately considered, second layer 24b has a different thickness over sidewall portions of each opening which are disposed at common distances above the base with which it is joined. In this example, second layer 24b can be formed over the entirety of the sidewalls of only one opening, i.e. sidewalls 23a, where material 32b has a greater degree of taper within opening 20. Additionally, material of second layer 24 occludes a top portion of opening 20.

Referring to FIG. 10, material within opening 22 is removed elevationally below the exposed portion of base 23 (FIG. 9). Such material is preferably etched substantially selectively relative to material from which sidewall spacers 30 are formed. Accordingly, such etch does not etch material from elevation ally below base 21 of opening 20. Such etch preferably defines a selected second depth which is greater than the first depth. Exemplary conditions using the Lam 9100 etcher are as follows: TCP power at 450 Watts, Bias power at 750 Watts, with gas flows of $CHF_3$ at 50 sccm, Ar at 15 sccm and a pressure of 18 mTorr. Using the above etch parameters, a second depth of about 20,000 Angstrom can be achieved in about 85 seconds. Alternately considered, the etching of the material elevationally below base 23 comprises not etching material elevationally below base 21.

In a preferred embodiment, a pair of contact openings can be formed utilizing a dual source, high density plasma etcher such as a Lam 9100 Etcher. Such etchers include an inductive power source and a wafer receiver which can be powered at suitable powers during wafer processing. A substrate is provided onto the wafer receiver and includes a first layer through which a pair of contact openings are to be etched. After the substrate is masked as described above, the substrate can be plasma etched with a fluorine-comprising gas such as $CHF_3$, while the wafer receiver is powered as described above. Such etching preferably defines a pair of first contact openings. In the illustrated dual source example, the inductive source is preferably powered at a first power, e.g. 450 Watts, while the wafer receiver is powered at a second power, e.g. 750 Watts. After the etching of the first contact openings, the power to the wafer receiver can be reduced, e.g. set at from between 0 to 50 Watts, and, utilizing the fluorine-comprising gas mentioned above, second layer 24 can be deposited within the pair of openings. Subsequently, material of the first layer can be selectively etched relative to material of the second layer to form a second opening within only one of the pair of openings to a second selected etch depth. All this can occur sequentially in the same chamber without breaking vacuum.

Advantages of the present invention include that openings, in particular contact openings, can be controllably etched to variable depths or elevations over a substrate. Additionally, the invention can be utilized in processing scenarios wherein contact openings are to be formed in connection with dual damascene processing techniques.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method comprising:
   providing a semiconductive substrate;
   contemporaneously etching a plurality of substrate features over the substrate, at least some of the features having transverse cross sections which are different from and larger than transverse cross sections of other features, said other features being etched to a first depth;
   forming a layer of material over the substrate sufficient to occlude at least some of said other features; and
   with said other features being occluded, further etching at least some of the features having the larger transverse cross sections while maintaining said other features at said first depth.

2. The semiconductor processing method of claim 1 further comprising prior to said further etching, removing portions of said layer of material from over the feature portions which are to be further etched, and not exposing bottom portions of said other features which are maintained at said first depth.

3. The semiconductor processing method of claim 2, wherein said removing comprises anisotropically etching said layer of material.

4. A semiconductor processing method of forming a pair of openings comprising:
   forming a pair of openings in a first layer which is formed over a substrate, the openings being formed to first selected depths which are defined by respective opening bases;
   forming a second layer within the openings and over the opening bases, the second layer having different thicknesses relative to the bases over which it is formed;
   exposing a portion of the base of only one of the openings through the second layer; and
   removing material elevationally below the exposed portion of the one base.

5. The semiconductor processing method of claim 4, wherein the first selected depths are substantially the same.

6. The semiconductor processing method of claim 4, wherein the openings are defined in part by respective sidewalls, and the exposing of the base portion of the one opening comprises etching the second layer sufficient to form sidewalls spacers over the sidewall of the one opening.

7. The semiconductor method of claim 4, wherein the thickness of the second layer over the base of the one opening is less than the thickness of the second layer over the base of the other of the openings.

8. The semiconductor processing method of claim 4, wherein the removing of the material elevation ally below the exposed base portion comprises etching said material selectively relative to material from which the second layer is formed.

9. The semiconductor processing method of claim 4, wherein the openings are defined in part by respective sidewalls, and the forming of the second layer comprises leaving at least a portion of one of the sidewalls uncovered with second layer material.

10. The semiconductor processing method of claim 4, wherein:
    the openings are defined in part by respective sidewalls, and the exposing of the base portion of the one opening comprises etching the second layer sufficient to form sidewalls spacers over the sidewall of the one opening; and
    the removing of the material elevationally below the exposed base portion comprises etching said material selectively relative to material from which the second layer is formed.

11. The semiconductor processing method of claim 4 further comprising forming a layer of patterned photoresist over the substrate, the pair of openings being formed through the patterned photoresist, and further comprising forming the second layer over the photoresist.

12. A semiconductor processing method of forming a pair of openings comprising:
    forming a pair of openings in a first layer which is formed over a substrate, the openings being defined in part by respective bases joined with respective sidewalls;
    forming a second layer within the openings and over at least some of the sidewalls of each opening, the second layer having a different thickness over sidewall portions of each opening which are disposed at common substrate elevations;

exposing a portion of one of the opening bases through the second layer; and removing material elevationally below the exposed portion of one the base.

13. The semiconductor processing method of claim 12, wherein the forming of the second layer comprises forming the second layer over the entirety of the sidewalls of only one of the openings.

14. The semiconductor processing method of claim 12, wherein one of the openings has a transverse cross section which is greater than a transverse cross section of the other of the openings at said common substrate elevation.

15. The semiconductor processing method of claim 14, wherein the forming of the second layer comprises occluding a top portion of the other of the openings with second layer material.

16. The semiconductor processing method of claim 12, wherein the exposing of the base portion comprises etching the second layer sufficient to form sidewall spacers over the sidewalls joined with the one opening base.

17. A semiconductor processing method of forming a pair of openings comprising:

forming a pair of openings in a first layer which is formed over a substrate, the openings being defined in part by respective bases joined with respective sidewalls;

forming a second layer within the openings and over at least some of the sidewalls of each opening, the second layer having a different thickness over sidewall portions of each opening which are disposed at common distances above the base with which it is joined; and etching material of only one of the openings elevationally below its associated base.

18. The semiconductor processing method of claim 17, wherein the forming of the pair of openings comprises:

forming a masking layer over the first layer;

patterning a pair of masking layer openings into the masking layer; and etching the first layer through the masking layer openings to form the first openings in the first layer.

19. The semiconductor processing method of claim 18, wherein the etching of the material of the one opening comprises:

first etching the second layer within the one opening to provide sidewall spacers over the sidewalls thereof and portions of the masking layer; and selectively etching the material of the one opening relative to second layer material.

20. The semiconductor processing method of claim 17 further comprising prior to the etching of the material of the one opening, forming sidewall spacers comprising material of the second layer over the sidewalls of the one opening.

21. The semiconductor processing method of claim 20, wherein the etching of the material of the one opening comprises selectively etching said material relative to the sidewall spacers.

22. The semiconductor processing method of claim 17, wherein the forming of the second layer comprises occluding a top portion of one of the openings with second layer material.

23. The semiconductor processing method of claim 17, wherein the forming of the second layer comprises leaving a portion of one of the openings' sidewalls uncovered with second layer material.

24. A semiconductor processing method of forming a pair of openings comprising:

forming a pair of openings in a layer which is formed over a substrate, the openings being formed to a first selected depth which is defined in part by respective bases joined with respective sidewalls;

with the same material, forming (a) sidewall spacers over a predominate portion of the sidewalls of only one of the two openings, and (b) a layer over a predominate portion of the base of only the other of the two openings; and selectively etching material elevationally below the base of the one opening relative to the material comprising the sidewall spacers and to a selected second depth which is greater than the first depth.

25. The semiconductor processing method of claim 24, wherein the etching of the material comprises not etching material elevationally below the base of the other of the openings.

26. The semiconductor processing method of claim 24, wherein the forming of the pair of openings comprises forming said openings to have different transverse cross sections.

27. The semiconductor processing method of claim 24 further comprising prior to the forming of the sidewall spacers and layer, forming said same material within the openings sufficient to redefine a narrower opening inside the one opening and to occlude the other opening.

28. The semiconductor processing method of claim 24 further comprising prior to the forming of the sidewall spacers and layer, forming said same material within the openings sufficient to redefine narrower openings inside both respective openings.

29. The semiconductor processing method of claim 24 further comprising prior to the forming of the sidewall spacers and layer, forming said same material within the one opening, and wherein the forming of the sidewall spacers comprises anisotropically etching said same material.

30. The semiconductor processing method of claim 29, wherein the forming of the sidewall spacers comprises forming portions of the sidewall spacers over a previously-formed masking layer defining the one opening.

31. A semiconductor processing method of forming a pair of openings comprising:

etching a pair of openings to a first selected depth into a layer which is formed over a substrate, the openings being defined in part by respective sidewalls which are joined with respective bases, the sidewalls defining a minimum distance therebetween for each respective opening, the minimum distances being different;

forming sidewall spacers over the sidewalls of only one of the openings;

forming a layer of material over the base of the other of the openings; and selectively removing material elevationally below the base of the one opening relative to the sidewall spacers and to a second selected depth.

32. The semiconductor processing method of claim 31, wherein the sidewall spacers and the layer of material comprise the same material.

33. The semiconductor processing method of claim 32, wherein the forming of the sidewall spacers and the layer of material comprise forming said same material within both of said openings and anisotropically etching said same material.

34. The semiconductor processing method of claim 33, wherein the forming of said same material comprises occluding said other of the openings.

35. A semiconductor processing method of forming a pair of openings comprising:

forming a first layer over a substrate;

first etching two openings into the first layer, the openings not extending entirely through the layer and terminating proximate respective opening bases;

providing a second layer over less than an entirety of one of the opening bases, and over an entirety of the other of the openings' bases; and etching through the base of the one opening substantially selective to second layer material.

36. A semiconductor processing method of forming a pair of openings comprising:

etching a pair of openings over a substrate to a first selected depth;

depositing a polymer film at least partially within the openings, one of the openings being occluded by the polymer film, the other opening not being occluded by the polymer film;

exposing at least a portion of a base of the other opening by removing the polymer film from thereover; and etching through said exposed portion.

37. The semiconductor processing method of claim 36, wherein the exposing comprises exposing only a portion of the other opening base.

38. The semiconductor processing method of claim 36, wherein said pair of openings are defined in part by sidewalls, and the exposing of the portion of the base of the other opening comprises etching the polymer layer sufficient to leave sidewall spacers over the sidewalls of the other opening.

39. The semiconductor processing method of claim 36, wherein the exposing of the portion of the base comprises conducting a maskless anisotropic etch of the polymer layer.

40. A semiconductor processing method of forming a pair of contact openings comprising:

forming a layer of photoresist over a first substrate layer through which a pair of contact openings are to be etched;

patterning a pair of openings into the photoresist over the first substrate layer;

etching the first substrate layer through the photoresist openings to a first selected depth to form first openings within the first layer;

forming a second layer over the photoresist and within the first openings; and etching the first substrate layer within only one of the first openings to a second selected depth.

41. The semiconductor processing method of claim 40, wherein the forming of the second layer occludes only one of the first openings and conformally covers within the other of the first openings.

42. The semiconductor processing method of claim 40 further comprising after the forming of the second layer, anisotropically etching the second layer and exposing a portion of one of the first openings.

43. The semiconductor processing method of claim 40 further comprising removing the photoresist after the etching of the first substrate layer within only one of the first openings to a second selected depth.

44. The semiconductor processing method of claim 40 further comprising:

after the forming of the second layer, anisotropically etching the second layer and exposing a portion of one of the first openings; and wherein the etching of the first substrate layer within the one first opening comprises selectively etching said layer relative to material of the second layer.

45. A semiconductor processing method of forming a pair of contact openings:

providing a dual source high density plasma etcher, the etcher having a wafer receiver configured to be powered during wafer processing;

providing a substrate onto the wafer receiver, the substrate having a first layer formed thereover and through which a pair of contact openings are to be etched;

plasma etching the substrate while the wafer receiver is powered at a first power, the etching defining a pair of openings in the first layer to a first selected depth;

reducing the power to the wafer receiver;

with the wafer receiver at a reduced power, depositing a second layer within the pair of openings; and selectively etching material of the first layer relative to material of the second layer, the selective etching forming an opening within only one of the pair of openings which extends to a second selected depth.

46. The semiconductor processing method of claim 45, wherein the openings are defined in part by sidewalls, and further comprising anisotropically etching the second layer sufficient to form sidewall spacers over the sidewalls of only one of the openings.

47. The semiconductor processing method of claim 45, wherein the depositing of the second layer comprises occluding a top portion of only one of the openings.

48. The semiconductor processing method of claim 45, wherein the openings are defined in part by sidewalls, and the depositing of the second layer comprises occluding a top portion of only one of the openings, and further comprising anisotropically etching the second layer sufficient to form sidewall spacers over the sidewalls of the opening which is not occluded with second layer material.

49. The semiconductor processing method of claim 45, wherein the reducing of the power comprises providing no power to the wafer receiver during said depositing.

* * * * *

UNITED STATES PATENT AND TRADEMARK OFFICE
CERTIFICATE OF CORRECTION

PATENT NO : 6,025,276

DATED : February 15, 2000

INVENTOR(S) : Kevin G. Donohoe and Werner Juengling

It is certified that error appears in the above-identified patent and that said Letters Patent is hereby corrected as shown below:

On title page, item 57 ABSTRACT
  replace "elevation ally"
  with --elevationally--.

On title page, item 57 ABSTRACT
  replace "elevation ally"
  with --elevationally--.

Col. 1, line 59
  replace "elevation ally"
  with --elevationally--.

Col. 4, line 6
  replace "elevation ally"
  with --elevationally--.

Col. 4, line 10
  replace "elevation ally"
  with --elevationally--.

Col. 4, line 23
  replace "elevation ally"
  with --elevationally--.

Col. 4, line 24
  replace "elevation ally"
  with --elevationally--.

Col. 4, line 65
  replace "elevation ally"
  with --elevationally--.

UNITED STATES PATENT AND TRADEMARK OFFICE
CERTIFICATE OF CORRECTION

PATENT NO : 6,025,276
DATED : February 15, 2000
INVENTOR(S) : Kevin G. Donohoe and Werner Juengling It is certified that error appears in the above-identified patent and that said Letters Patent is hereby corrected as shown below:

Col. 5, line 2
replace "elevation ally"
with --elevationally--.

Col. 6, line 36
replace "elevation ally"
with --elevationally--.

Signed and Sealed this

Twentieth Day of March, 2001

Attest:

NICHOLAS P. GODICI

Attesting Officer

Acting Director of the United States Patent and Trademark Office